(12) United States Patent
Huang et al.

(10) Patent No.: US 11,764,174 B2
(45) Date of Patent: Sep. 19, 2023

(54) SEMICONDUCTOR STRUCTURE

(71) Applicant: United Microelectronics Corp., Hsinchu (TW)

(72) Inventors: Chun-Chi Huang, Tainan (TW);
Hui-Lung Chou, Kaohsiung (TW);
Chuang-Han Hsieh, Tainan (TW);
Yung-Feng Lin, Tainan (TW);
Shin-Chi Chen, Penghu County (TW)

(73) Assignee: United Microelectronics Corp., Hsinchu (TW)

( * ) Notice: Subject to any disclaimer, the term of this patent is extended or adjusted under 35 U.S.C. 154(b) by 169 days.

(21) Appl. No.: 17/534,419

(22) Filed: Nov. 23, 2021

(65) Prior Publication Data
US 2023/0136978 A1 May 4, 2023

(30) Foreign Application Priority Data

Oct. 28, 2021 (CN) .......................... 202111262076.8

(51) Int. Cl.
*H01L 21/00* (2006.01)
*H01L 23/00* (2006.01)
*H01L 23/528* (2006.01)
*H01L 23/532* (2006.01)

(52) U.S. Cl.
CPC ............ *H01L 24/02* (2013.01); *H01L 23/528* (2013.01); *H01L 24/05* (2013.01); *H01L 23/53295* (2013.01); *H01L 2224/0219* (2013.01); *H01L 2224/02181* (2013.01); *H01L 2224/02185* (2013.01); *H01L 2224/05557* (2013.01)

(58) Field of Classification Search
CPC ........ H01L 24/02; H01L 23/528; H01L 24/05
See application file for complete search history.

(56) References Cited

U.S. PATENT DOCUMENTS

| 10,553,479 | B2 * | 2/2020 | Yen .................... H01L 21/76832 |
| 10,923,391 | B2 * | 2/2021 | Yen .................... H01L 23/53295 |
| 11,410,878 | B2 * | 8/2022 | Yen ....................... H01L 23/5329 |
| 2011/0012229 | A1 * | 1/2011 | Hsu .......................... H01L 28/60 |
| | | | 257/532 |

(Continued)

FOREIGN PATENT DOCUMENTS

| CN | 108447767 A | * | 8/2018 | ....... H01L 21/02104 |
| CN | 108447767 B | * | 6/2022 | ....... H01L 21/02104 |

(Continued)

*Primary Examiner* — Laura M Menz
(74) *Attorney, Agent, or Firm* — JCIPRNET

(57) ABSTRACT

A semiconductor structure including a substrate, a dielectric layer, a first conductive layer, and a passivation layer is provided. The dielectric layer is disposed on the substrate. The first conductive layer is disposed on the dielectric layer. The passivation layer is disposed on the first conductive layer and the dielectric layer. The passivation layer includes a first upper surface and a second upper surface. The first upper surface is located above a top surface of the first conductive layer. The second upper surface is located on one side of the first conductive layer. A height of the first upper surface is higher than a height of the second upper surface. The height of the second upper surface is lower than or equal to a height of a lower surface of the first conductive layer located between a top surface of the dielectric layer and the first conductive layer.

20 Claims, 3 Drawing Sheets

(56) References Cited

U.S. PATENT DOCUMENTS

| | | | |
|---|---|---|---|
| 2018/0233466 A1* | 8/2018 | Yen | H01L 24/05 |
| 2019/0081000 A1* | 3/2019 | Weng | H01L 23/53214 |
| 2020/0161177 A1* | 5/2020 | Yen | H01L 23/3192 |
| 2021/0125860 A1* | 4/2021 | Yen | H01L 24/05 |
| 2021/0193575 A1* | 6/2021 | Weng | H01L 23/53214 |
| 2022/0359276 A1* | 11/2022 | Yen | H01L 21/76852 |
| 2023/0136978 A1* | 5/2023 | Huang | H01L 24/03 |
| | | | 257/773 |

FOREIGN PATENT DOCUMENTS

| | | | | |
|---|---|---|---|---|
| CN | 116053249 A | * | 5/2023 | H01L 23/528 |
| WO | WO-2019012854 A1 | * | 1/2019 | H01L 21/3205 |

* cited by examiner

SEMICONDUCTOR STRUCTURE

CROSS-REFERENCE TO RELATED APPLICATION

This application claims the priority benefit of China application serial no. 202111262076.8, filed on Oct. 28, 2021. The entirety of the above-mentioned patent application is hereby incorporated by reference herein and made a part of this specification.

BACKGROUND

Technical Field

The disclosure relates to a semiconductor structure, and in particular, to a semiconductor structure with a passivation layer.

Description of Related Art

In some semiconductor structures, a passivation layer is formed on a conductive layer. However, in the further high-temperature fabrication process, the conductive layer may expand due to the heat, and stress is generated on the passivation layer. As a result, a crack is generated at a corner of the passivation layer. Therefore, how to reduce the stress applied to the passivation layer is a field that is currently worked on.

SUMMARY

The disclosure is directed to a semiconductor structure capable of effectively reducing stress applied to a passivation layer.

The disclosure provides a semiconductor structure including a substrate, a dielectric layer, a first conductive layer, and a passivation layer. The dielectric layer is disposed on the substrate. The first conductive layer is disposed on the dielectric layer. The passivation layer is disposed on the first conductive layer and the dielectric layer. The passivation layer includes a first upper surface and a second upper surface. The first upper surface is located above a top surface of the first conductive layer. The second upper surface is located on one side of the first conductive layer. A height of the first upper surface is higher than a height of the second upper surface. The height of the second upper surface is lower than or equal to a height of a lower surface of the first conductive layer located between a top surface of the dielectric layer and the first conductive layer.

According to an embodiment of the disclosure, in the semiconductor structure, the passivation layer may include multiple insulating layers. An uppermost insulating layer of the insulating layers may be a nitride layer. The uppermost insulating layer of the insulating layers may have the first upper surface and the second upper surface.

According to an embodiment of the disclosure, in the semiconductor structure, one side of the first conductive layer may have an opening. The passivation layer may be located on a sidewall of the opening and a bottom surface of the opening.

According to an embodiment of the disclosure, in the semiconductor structure, the opening may extend into the dielectric layer.

According to an embodiment of the disclosure, in the semiconductor structure, an included angle between the sidewall of the opening and the bottom surface of the opening may be greater than 95 degrees and less than or equal to 120 degrees.

According to an embodiment of the disclosure, in the semiconductor structure, the included angle between the sidewall of the opening and the bottom surface of the opening may be greater than or equal to 95.5 degrees and less than or equal to 110 degrees.

According to an embodiment of the disclosure, in the semiconductor structure, the passivation layer may include a first insulating layer and a second insulating layer. The second insulating layer is disposed on the first insulating layer. The second insulating layer may have the first upper surface and the second upper surface.

According to an embodiment of the disclosure, in the semiconductor structure, an included angle between a sidewall of the second insulating layer and a bottom surface of the second insulating layer may be greater than 95 degrees and less than or equal to 120 degrees.

According to an embodiment of the disclosure, in the semiconductor structure, the included angle between the sidewall of the second insulating layer and the bottom surface of the second insulating layer may be greater than or equal to 95.5 degrees and less than or equal to 110 degrees.

According to an embodiment of the disclosure, in the semiconductor structure, the dielectric layer may have a rounded corner at a position that is adjacent to a bottom of the opening.

According to an embodiment of the disclosure, in the semiconductor structure, the passivation layer may further include a connection surface. The connection surface is located between the first upper surface and the second upper surface and is connected to the first upper surface and the second upper surface.

According to an embodiment of the disclosure, in the semiconductor structure, a portion of the passivation layer may be located in the dielectric layer.

According to an embodiment of the disclosure, in the semiconductor structure, the first conductive layer may be a single-layer structure.

According to an embodiment of the disclosure, in the semiconductor structure, the first conductive layer may be a multilayer structure.

According to an embodiment of the disclosure, in the semiconductor structure, the first conductive layer may include a barrier layer and a conductor layer. The conductor layer is disposed on the barrier layer.

According to an embodiment of the disclosure, in the semiconductor structure, the semiconductor structure may further include a second conductive layer. The second conductive layer is located between the dielectric layer and the substrate.

According to an embodiment of the disclosure, in the semiconductor structure, the first conductive layer and the second conductive layer may be separated from each other through the dielectric layer.

According to an embodiment of the disclosure, in the semiconductor structure, the first conductive layer may be electrically connected to the second conductive layer.

According to an embodiment of the disclosure, in the semiconductor structure, the passivation layer may expose a portion of the first conductive layer.

According to an embodiment of the disclosure, in the semiconductor structure, the semiconductor structure may further include a cap layer. The cap layer is located between the dielectric layer and the second conductive layer.

Based on the above, in the semiconductor structure provided in the disclosure, since the height of the second upper surface of the passivation layer is lower than or equal to the height of the lower surface of the first conductive layer located between the top surface of the dielectric layer and the first conductive layer, the stress applied to the passivation layer may be effectively reduced. Therefore, a crack generated on the passivation layer may be prevented so that an electrical performance of a semiconductor device is enhanced.

In order to make the aforementioned features and advantages of the disclosure comprehensible, embodiments accompanied with drawings are described in detail below.

DESCRIPTION OF THE EMBODIMENTS

Reference will now be made in detail to the embodiments of the disclosure, examples of which are illustrated in the accompanying drawings, but the provided examples are not used to limit the scope of the invention. In addition, the drawings are for illustrative purposes only, and are not drawn according to the original dimensions. In order to facilitate understanding, the same elements will be described with the same symbols in the following description.

Figure 1:
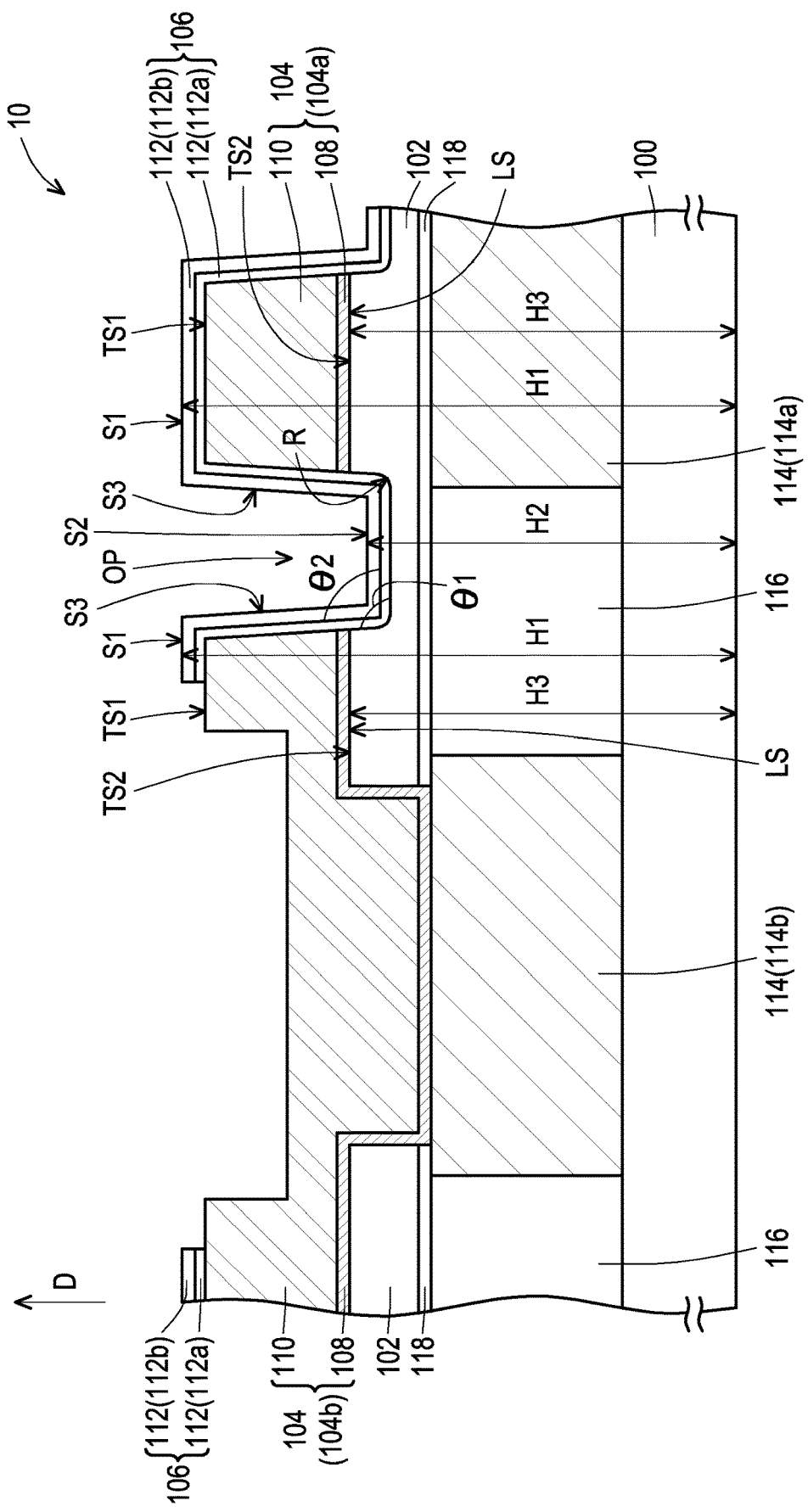
FIG. 1 is a cross-sectional diagram of a semiconductor structure according to some embodiments of the disclosure.
Figure 2:
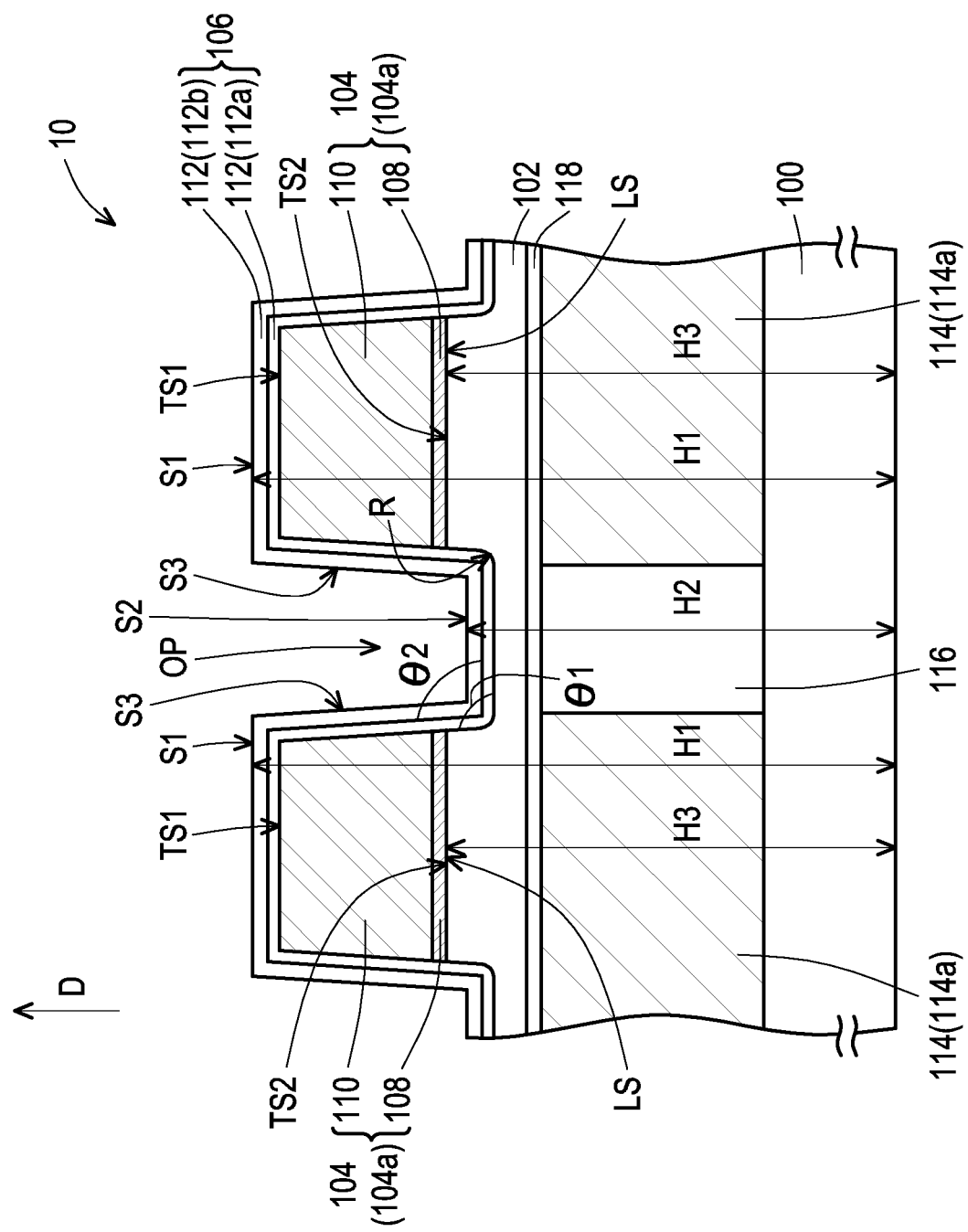
FIG. 2 is a cross-sectional diagram of a semiconductor structure according to other embodiments of the disclosure.
Figure 3:
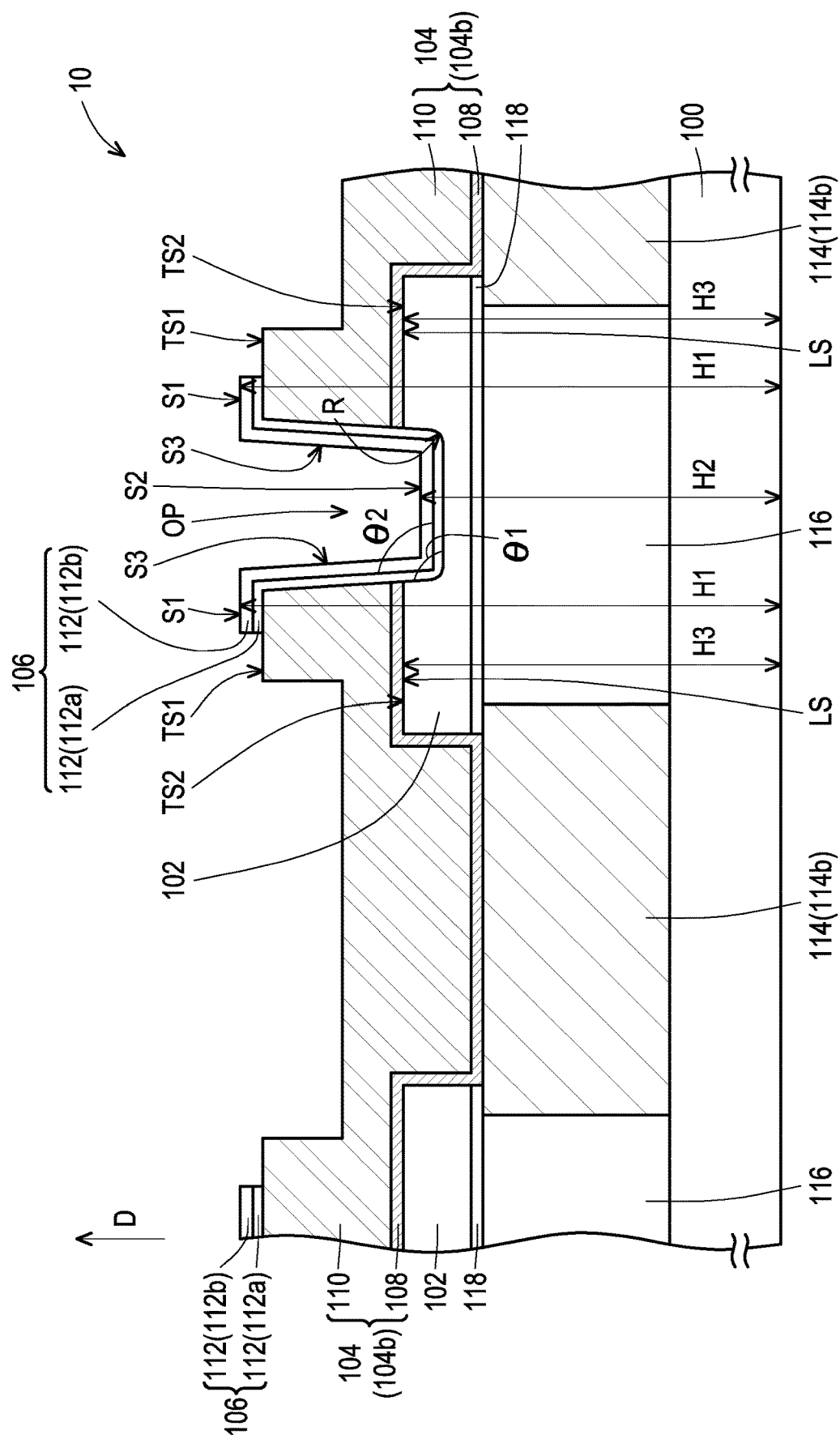
FIG. 3 is a cross-sectional diagram of a semiconductor structure according to other embodiments of the disclosure.

FIG. 1 is a cross-sectional diagram of a semiconductor structure according to some embodiments of the disclosure. FIG. 2 is a cross-sectional diagram of a semiconductor structure according to other embodiments of the disclosure. FIG. 3 is a cross-sectional diagram of a semiconductor structure according to other embodiments of the disclosure.

Referring to FIG. 1, a semiconductor structure 10 includes a substrate 100, a dielectric layer 102, a conductive layer 104, and a passivation layer 106. The substrate 100 may be a semiconductor substrate, such as a silicon substrate. In addition, although it is not shown in FIG. 1, an element required for a doped region and/or an isolation structure may be included in the substrate 100, and an element required for a semiconductor device (e.g. an active device and/or a passive device), a dielectric layer, and an interconnect structure may be included in the substrate 100. The description thereof is omitted.

The dielectric layer 102 is disposed on the substrate 100. The dielectric layer 102 may be an inter-metal dielectric (IMD) layer. A material of the dielectric layer 102 may be, for example, an oxide, such as silicon oxide.

The conductive layer 104 is disposed on the dielectric layer 102. The conductive layer 104 may be a single-layer structure or a multilayer structure. In some embodiments, the conductive layer 104 may be a top metal layer in the semiconductor structure 10. In the embodiment, the conductive layer 104 is, for example, a multilayer structure. For example, the conductive layer 104 may include a barrier layer 108 and a conductor layer 110. A material of the barrier layer 108 is, for example, titanium (Ti), titanium nitride (TiN), tantalum (Ta), tantalum nitride (TaN), or a combination thereof. The conductor layer 110 is disposed on the barrier layer 108. The conductor layer 110 is, for example, a metal layer. In the embodiment, the conductor layer 110 may be the top metal layer in the semiconductor structure 10. A material of the conductor layer 110 is, for example, aluminum.

In some embodiments, the semiconductor structure 10 may include multiple conductive layers 104; however, the disclosure is not limited thereto. The semiconductor structure 10 including one or more than one conductive layer 104 belongs to the scope of the disclosure. In the embodiment, the semiconductor structure 10 may include a conductive layer 104a and a conductive layer 104b adjacent to each other. The conductive layer 104a may be a conductive line, and the conductive layer 104b may be a pad.

The passivation layer 106 is disposed on the conductive layer 104 and the dielectric layer 102. In addition, a portion of the passivation layer 106 may be located in the dielectric layer 102. The passivation layer 106 includes an upper surface S1 and an upper surface S2. The upper surface S1 is located above a top surface TS1 of the conductive layer 104. The upper surface S2 is located on one side of the conductive layer 104. A height H1 of the upper surface S1 is higher than a height H2 of the upper surface S2. The height H2 of the upper surface S2 is lower than or equal to a height H3 of a lower surface LS of the conductive layer 104 located between a top surface TS2 of the dielectric layer 102 and the conductive layer 104 so that stress applied to the passivation layer 106 may be effectively reduced. In addition, the passivation layer 106 may further include a connection surface S3. The connection surface S3 is located between the upper surface S1 and the upper surface S2 and is connected to the upper surface S1 and the upper surface S2.

Furthermore, the passivation layer 106 may include multiple insulating layers 112; however, the disclosure is not limited thereto. The passivation layer 106 including one or more than one insulating layer 112 belongs to the scope of the disclosure. For example, the passivation layer 106 may include an insulating layer 112a and an insulating layer 112b. The insulating layer 112a may be an oxide layer. A material of the insulating layer 102a is, for example, a silicon oxide. The insulating layer 112b is disposed on the insulating layer 112a. The uppermost insulating layer 112 (e.g. the insulating layer 112b) of the insulating layers 112 may have the upper surface S1 and the upper surface S2. The uppermost insulating layer 112 (e.g. the insulating layer 112b) of the insulating layers 112 may be a nitride layer. A material of the insulating layer 112 may be, for example, silicon nitride or silicon oxynitride.

In addition, one side of the conductive layer 104 may have an opening OP. The opening OP may be located between the two conductive layers 104 (e.g. the conductive layer 104a and the conductive layer 104b) adjacent to each other. The passivation layer 106 may be located on a sidewall of the opening OP and a bottom surface of the opening OP. The opening OP may extend into the dielectric layer 102. In some embodiments, an included angle θ1 between the sidewall of the opening OP and the bottom surface of the opening OP may be greater than 95 degrees and less than or equal to 120 degrees. In some embodiments, the included angle θ1 between the sidewall of the opening OP and the bottom surface of the opening OP may be greater than or equal to 95.5 degrees and less than or equal to 110 degrees. By setting the included angle θ1 between the sidewall of the opening OP and the bottom surface of the opening OP in the range above, the dielectric layer 102 may have a rounded corner R at a position adjacent to a bottom of the opening OP, and the stress applied to the passivation layer 106 may be further reduced. In some embodiments, an included angle θ2 between a sidewall of the insulating layer 112b and a bottom surface of the insulating layer 112b may be greater than 95 degrees and less than or equal to 120 degrees. In some embodiments, the included angle θ2 between the sidewall of the insulating layer 112b and the bottom surface of the insulating layer 112b may be greater than or equal to 95.5 degrees and less than or equal to 110 degrees.

The semiconductor structure 10 may further include a conductive layer 114. The conductive layer 114 is located between the dielectric layer 102 and the substrate 100. A material of the conductive layer 114 is, for example, copper. In addition, the semiconductor structure 10 may include multiple conductive layers 114; however, the disclosure is not limited thereto. The semiconductor structure 10 including one or more than one conductive layer 114 belongs to the scope of the disclosure. For example, the semiconductor structure 10 may include a conductive layer 114a and a conductive layer 114b. The conductive layer 104 may be overlapped with the corresponding conductive layer 114 in a direction D perpendicular to the substrate 100. For example, the conductive layer 104a may be overlapped with the conductive layer 114a in the direction D perpendicular to the substrate 100. The conductive layer 104a (e.g. the conductive line) and the conductive layer 114a may be separated from each other through the dielectric layer 102. The passivation layer 106 may cover the conductive layer 104a (e.g. the conductive line). The conductive layer 104b may be overlapped with the conductive layer 114b in the direction D perpendicular to the substrate 100. The conductive layer 104b (e.g. the pad) may be electrically connected to the conductive layer 114b. The passivation layer 106 may expose a portion of the conductive layer 104b (e.g. the pad).

The semiconductor structure 10 may further include a dielectric layer 116. The dielectric layer 116 is located between the dielectric layer 102 and the substrate 100. The conductive layer 114 may be located in the dielectric layer 116. In addition, the dielectric layer 116 may be located between the conductive layer 114a and the conductive layer 114b. The dielectric layer 116 may be an inter-metal dielectric layer. The dielectric layer 116 may be a single-layer structure or a multilayer structure. A material of the dielectric layer 116 may be an oxide (e.g. silicon oxide), a nitride (e.g. silicon oxynitride, silicon carbon-nitride, or silicon nitride), or a combination thereof.

The semiconductor structure 10 may further include a cap layer 118. In the embodiment, the cap layer 118 may be located between the dielectric layer 102 and the conductive layer 114 and between the dielectric layer 102 and the dielectric layer 116. A material of the cap layer 118 is, for example, a nitride (e.g. silicon nitride).

In the embodiment, the semiconductor structure 10 includes, for example, the conductive layer 104a (e.g. the conductive line) and the conductive layer 104b (e.g. the pad) located at the two sides of the opening OP; however, the disclosure is not limited thereto. In other embodiments, as shown in FIG. 2, the semiconductor structure 10 may include the two conductive layers 104a (e.g. the conductive lines) located at the two sides of the opening OP. In other embodiments, as shown in FIG. 3, the semiconductor structure 10 may include the two conductive layers 104b (e.g. the pads) located at the two sides of the opening OP.

Based on the embodiments above, in the semiconductor structure 10, since the height H2 of the upper surface S2 of the passivation layer 106 is lower than or equal to the height H3 of the lower surface LS of the conductive layer 104 located between the top surface TS2 of the dielectric layer 102 and the conductive layer 104, the stress applied to the passivation layer 106 may be effectively reduced. Therefore, a crack generated on the passivation layer 106 may be prevented so that an electrical performance of a semiconductor device is enhanced.

In summary of the above, the semiconductor structure of the embodiments may effectively reduce the stress applied to the passivation layer so that the crack generated on the passivation layer may be prevented and the electrical performance of the semiconductor device is thus enhanced.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A semiconductor structure, comprising:
   a substrate;
   a dielectric layer disposed on the substrate;
   a first conductive layer disposed on the dielectric layer; and
   a passivation layer disposed on the first conductive layer and the dielectric layer, wherein
   the passivation layer comprises a first upper surface and a second upper surface,
   the first upper surface is located above a top surface of the first conductive layer,
   the second upper surface is located on one side of the first conductive layer,
   a height of the first upper surface is higher than a height of the second upper surface, and
   the height of the second upper surface is lower than or equal to a height of a lower surface of the first conductive layer located between a top surface of the dielectric layer and the first conductive layer.

2. The semiconductor structure according to claim 1, wherein the passivation layer comprises a plurality of insulating layers, wherein an uppermost insulating layer of the insulating layers is a nitride layer, and the uppermost insulating layer of the insulating layers has the first upper surface and the second upper surface.

3. The semiconductor structure according to claim 1, wherein there is an opening located on the side of the first conductive layer, and the passivation layer is located on a sidewall of the opening and a bottom surface of the opening.

4. The semiconductor structure according to claim 3, wherein the opening extends into the dielectric layer.

5. The semiconductor structure according to claim 3, wherein an included angle between the sidewall of the opening and the bottom surface of the opening is greater than 95 degrees and less than or equal to 120 degrees.

6. The semiconductor structure according to claim 3, wherein an included angle between the sidewall of the opening and the bottom surface of the opening is greater than or equal to 95.5 degrees and less than or equal to 110 degrees.

7. The semiconductor structure according to claim 3, wherein the passivation layer comprises:
   a first insulating layer; and
   a second insulating layer disposed on the first insulating layer, wherein the second insulating layer has the first upper surface and the second upper surface.

8. The semiconductor structure according to claim 7, wherein an included angle between a sidewall of the second insulating layer and a bottom surface of the second insulating layer is greater than 95 degrees and less than or equal to 120 degrees.

9. The semiconductor structure according to claim 7, wherein an included angle between a sidewall of the second insulating layer and a bottom surface of the second insulating layer is greater than or equal to 95.5 degrees and less than or equal to 110 degrees.

10. The semiconductor structure according to claim 7, wherein the dielectric layer has a rounded corner at a position adjacent to a bottom of the opening.

11. The semiconductor structure according to claim 1, wherein the passivation layer further comprises:
a connection surface located between the first upper surface and the second upper surface and connected to the first upper surface and the second upper surface.

12. The semiconductor structure according to claim 1, wherein a portion of the passivation layer is located in the dielectric layer.

13. The semiconductor structure according to claim 1, wherein the first conductive layer comprises a single-layer structure.

14. The semiconductor structure according to claim 1, wherein the first conductive layer comprises a multilayer structure.

15. The semiconductor structure according to claim 1, wherein the first conductive layer comprises:
a barrier layer; and
a conductor layer disposed on the barrier layer.

16. The semiconductor structure according to claim 1, further comprising:
a second conductive layer located between the dielectric layer and the substrate.

17. The semiconductor structure according to claim 16, wherein the first conductive layer and the second conductive layer are separated from each other through the dielectric layer.

18. The semiconductor structure according to claim 16, wherein the first conductive layer is electrically connected to the second conductive layer.

19. The semiconductor structure according to claim 18, wherein the passivation layer exposes a portion of the first conductive layer.

20. The semiconductor structure according to claim 16, further comprising:
a cap layer located between the dielectric layer and the second conductive layer.

* * * * *